CONTROL APPARATUS
Filed Oct. 19, 1966
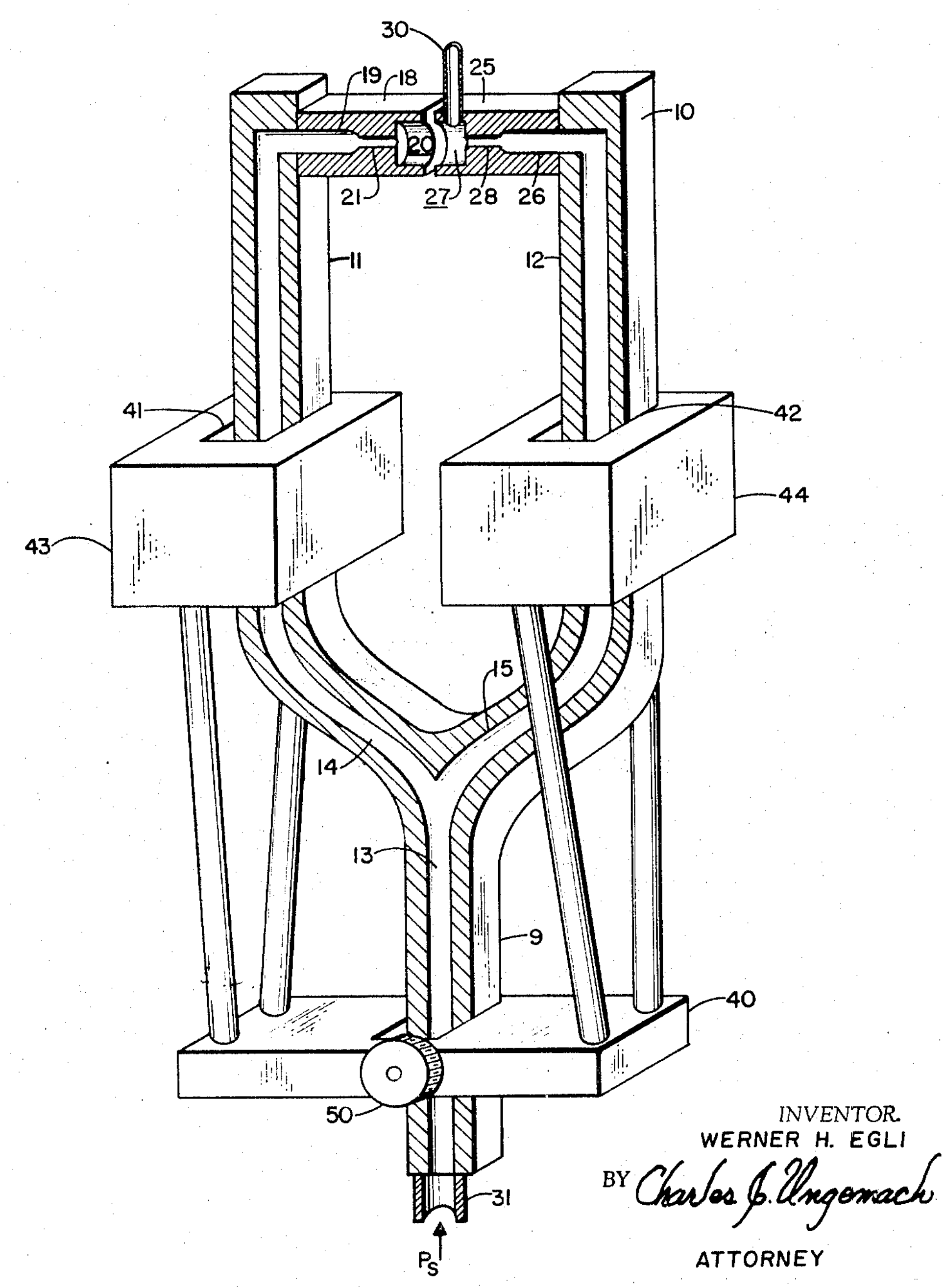
INVENTOR.
WERNER H. EGLI
BY Charles J. Ungemach
ATTORNEY United States Patent Office 3,454,025
Patented July 8, 1969

3,454,025

CONTROL APPARATUS

Werner H. Egli, Minneapolis, Minn., assignor to Honeywell Inc., Minneapolis, Minn., a corporation of Delaware Filed Oct. 19, 1966, Ser. No. 587,860
Int. Cl. F15c 3/12
U.S. Cl. 137—81.5 3 Claims

ABSTRACT OF THE DISCLOSURE

A fluid-mechanical constant frequency oscillator comprising a pair of mechanical elements each adapted for vibratory motion toward and away from the other and fluid coupling means mounted on and located between the elements. The elements contain internal passages for supplying fluid to a chamber formed by sections of the coupling means. The elements are driven by periodic buildup and release of pressure in the chamber as a result of movement of the sections of the coupling means which are attached to the elements.

This invention relates to a fluidic oscillator, and more specifically to an improved fluidic oscillator for producing a fluid signal at a constant predetermined frequency.

When building fluidic systems it is frequently desirable to have fluid oscillators that oscillate at constant predetermined frequencies for the purpose of providing reference signals for the system. For example, a constant high frequency signal is often compared to a variable high frequency signal to obtain a lower beat frequency signal. The beat frequency signal can be made to have an arbitrarily low frequency, and thus can be used with low frequency components or readily converted into a proportional signal. However, in order to obtain an accurate beat signal it is necessary to have a constant frequency reference signal.

There are fluid oscillators for producing output signals having constant frequencies, such as the tuning fork oscillator shown in the Taplin et al. 3,248,043 patent. The advantage of such an oscillator as shown in the Taplin patent over other prior art fluid oscillators such as the one shown in Warren 3,016,066 is that any variation of the temperature or composition of the fluid within the oscillator does not cause a change in the frequency of the output signal of the tuning fork type oscillator. That is, the output frequency of the oscillator shown in Warren, changes if the temperature or the composition of the fluid is changed. However, tuning fork oscillators such as shown in the Taplin patent tend to be difficult to maintain in oscillation because of the damping of the members. Conversely, operation of an oscillator such as Warren's is reliable because it is self sustaining.

I have invented an oscillator that employs a tuning fork similar to Taplin's but which eliminates the tendency of the oscillations to damp out. In addition, I have incorporated my power supply tubes within the tuning fork to avoid influence on the output frequency caused by the shifts of the externally located plumbing. Hence, in order to avoid problems of frequency dependency upon the temperature or composition of the gas, I have used a tuning fork type of oscillator, and also have incorporated an improved self-sustaining oscillaitng feature into the tuning fork oscillator to make it as reliable as an oscillator of the Warren type.

Briefly the invention comprises a tuning fork having two oppositely disposed members attached to its tines. A fluid is supplied to the oppositely disposed members causing the tuning fork to oscilalte at its natural frequency resulting in the generation of a series of pressure pulses having a frequency indicative of the natural frequency of the tuning fork.

For a better understanding of this invention reference should be had to the single drawing which shows my self-sustaining tuning fork oscillator partially in section.

Referring to the figure, a tuning fork 10 is shown having a first tine 11, a second tine 12, and a base 9. Located within tuning fork 10 is a first passage 13 that divides into a second passage 14 and a third passage 15. Passage 14 connects to a passage 19 located within a member 18 which is mounted on the free end of tine 11. Member 18 has a cylindrical chamber 20 therein connected to passage 19 through a smaller passage 21. Likewise passage 15 is connected to a passage 26 located within a member 25 which is mounted on the free end of tine 12. Located within member 25 is a cylindrical chamber 27 connected to passage 26 through a smaller passage 28. Chambers 20 and 27 are shown as equal in size but need not be for the present invention. Members 18 and 25 cooperate to form fluid coupling means which funcitons to cause oscillation of tines 11 and 12 as will hereinafter be described. Communicating with chamber 27 is a pressure tap 30 for obtaining an output signal from the tuning fork oscillator shown in the figure. A supply nozzle 31 is shown for supplying the fluid to the tuning fork oscillator. Although pressure tap 30 is located on member 25, it could also be placed in base 9 if the smaller passages 21 and 28 were also placed in the same relationship to the pressure tap as presently shown in the drawing.

Also shown in the figure is a housing 40 having a first mass 43 with an opening 41 through which tine 11 of tuning fork 10 protrudes and a second mass 44 with an opening 42 through which tine 12 protrudes. Housing 40 slides up and down along the length of the tuning fork 10, to thereby alter the position of the masses 43 and 44 along tines 11 and 12. Varying of the position of the masses along the tines 11 and 12 causes the natural frequency of the tuning fork to change, and hence vary the output signal that is obtained at pressure tap 30. A screw 50 is provided in housing, for the purpose of securing the housing against the tuning fork 10.

In the operation of my tuning fork oscillator shown in the figure, a fluid is supplied to passages 14 and 15 from power supply nozzle 31. The fluid from passages 14 and 15 flows into passages 19 and 26 respectively. The fluid then flows through conduits 21 and 28, which are narrower in dimension than passages 19 or 26. From passages 21 and 28 the fluid flows into oppositely disposed cylindrical chambers 20 and 27 causing the pressure in chambers 20 and 27 to increase thus pushing tines 11 and 12 away from each other. As the tines 11 and 12 are pushed away from each other the pressure in chambers 20 and 27 decreases allowing the tines 11 and 12 to move closer to one another until the pressure in the chambers 20 and 27 again increases and tines 11 and 12 are again driven away from one another. Because the chambers 20 and 27 have a certain capacitance associated with them, the pressure in chambers 20 and 27 lags the displacement of the tines 11 and 12 resulting in a net force that causes the oscillations to be sustained. The increase and decrease of pressure within chambers 20 and 27 causes the tuning fork 10 to oscillate at its natural frequency resulting in the generation of a series of pressure pulses at pressure tap 30 having a frequency indicative of the natural frequency of the tuning fork 10. That is, supplying a fluid to supply nozzle 31 causes the tuning fork to oscillate at its natural frequency and sets up a fluid signal at pressure tap 30 which is indicative of the frequency of oscillation in the tuning fork.

It has been found that by having the fluid supplied to oppositely disposed members, such as 18 and 25, the oscillations of the tuning fork tend to sustain themselves considerably better than if only one fluid stream is directed against a single tine of the tuning fork. The reason for the better oscillation sustaining characteritsic of my tuning fork oscillator is that when the members are placed oppositely as shown in the drawing, the force generated at the ends of the tines are equal and of opposite senses, resulting in a cancellation of the forces at the base of the tuning fork. If a force is directed at a single tine of the tuning fork there is no cancellation of the force at the base and hence there is a force present on the base of the tuning fork which results in movement thereof. The movement of the base of the tuning fork results in the dissipation of energy and hence causes damping of the oscillations of the tuning fork. However, if no force is present at the base of the tuning fork, such as in the device shown in the drawing, there can be no movement of the base of the tuning fork and hence no damping. Therefore oscillations of such a tuning fork oscillator are readily sustained.

I claim:

1. Apparatus of the class described comprising:

mechanical oscillatory means having first and second elements each adapted for vibratory motion toward and away from the other;

fluid coupling means mounted on said mechanical oscillatory means between the first and second elements thereof, said fluid coupling means operable to set the first and second elements into vibratory motion when supplied with fluid under pressure, said fluid coupling means including signal means operable to produce a signal indicative of the frequency of vibration of the first and second elements; and means including internal passages in said mechanical oscillatory means for supplying fluid to said fluid coupling means.

2. The apparatus of claim 1 further including means for varying the frequency of vibration of the first and second members.

3. The apparatus of claim 1 wherein said fluid coupling means comprises housing means including first and second separable sections mounted respectively on the first and second elements, said housing means defining a chamber and orifice means for introducing fluid supplied to said coupling means into the chamber, fluid introduced into the chamber causing the first and second sections thereof and the first and second elements to be driven apart, said housing means operable to release fluid from the chamber so as to reduce the pressure therein when the first and second sections are driven to substantially maximum separation.

References Cited

UNITED STATES PATENTS

| | | | |
|---|---|---|---|
| 3,260,456 | 7/1966 | Boothe | 137—81.5 XR |
| 3,275,015 | 9/1966 | Meier | 137—81.5 |
| 3,302,398 | 2/1967 | Taplin et al. | 137—81.5 XR |
| 3,333,596 | 8/1967 | Bottone | 137—81.5 |

SAMUEL SCOTT, *Primary Examiner.*